United States Patent
Chan et al.

(10) Patent No.: US 10,566,242 B2
(45) Date of Patent: Feb. 18, 2020

(54) MINIMIZATION OF PLASMA DOPING INDUCED FIN HEIGHT LOSS

(71) Applicant: Taiwan Semiconductor Manufacturing Co., Ltd., Hsinchu (TW)

(72) Inventors: Chia-Ling Chan, New Taipei (TW); Tsan-Chun Wang, Hsinchu (TW); Liang-Yin Chen, Hsinchu (TW); Huicheng Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/376,719

(22) Filed: Dec. 13, 2016

(65) Prior Publication Data
US 2018/0166341 A1    Jun. 14, 2018

(51) Int. Cl.
*H01L 21/8234*    (2006.01)
*H01L 21/223*    (2006.01)
*H01L 29/66*    (2006.01)

(52) U.S. Cl.
CPC .. *H01L 21/823431* (2013.01); *H01L 21/2236* (2013.01); *H01L 21/823418* (2013.01); *H01L 29/66803* (2013.01); *H01L 29/6656* (2013.01)

(58) Field of Classification Search
None
See application file for complete search history.

(56) References Cited

U.S. PATENT DOCUMENTS

| | | | | |
|---|---|---|---|---|
| 7,528,389 B2 * | 5/2009 | Fang | | H01J 37/3171 250/492.2 |
| 7,687,787 B2 * | 3/2010 | Godet | | H01J 37/3171 118/723 E |
| 2006/0289799 A1 * | 12/2006 | Fang | | H01J 37/3171 250/492.21 |
| 2007/0087574 A1 * | 4/2007 | Gupta | | H01J 37/32412 438/758 |
| 2009/0001890 A1 * | 1/2009 | Singh | | H01J 37/321 315/111.21 |
| 2009/0004836 A1 * | 1/2009 | Singh | | H01J 37/321 438/513 |
| 2009/0061605 A1 * | 3/2009 | Godet | | H01J 37/3171 438/511 |
| 2010/0273322 A1 * | 10/2010 | Papasouliotis | | H01L 21/2236 438/527 |
| 2014/0342537 A1 * | 11/2014 | Wu | | H01L 29/66795 438/513 |
| 2015/0380489 A1 * | 12/2015 | Chan | | H01L 27/0886 257/192 |

FOREIGN PATENT DOCUMENTS

WO    WO 2006099438 A1 *  9/2006  .......... H01J 37/3171

* cited by examiner

*Primary Examiner* — David E Graybill
(74) *Attorney, Agent, or Firm* — Sterne, Kessler, Goldstein & Fox P.L.L.C.

(57) ABSTRACT

A plasma doping process provides conformal doping profiles for lightly doped source/drain regions in fins, and reduces the plasma doping induced fin height loss. The plasma doping process overcomes the limitations caused by traditional plasma doping processes in fin structures that feature aggressive aspect ratios and tights pitches. Semiconductor devices with conformal lightly doped S/D regions and reduced fin height loss demonstrate reduced parallel resistance (Rp) and improved transistor performance.

20 Claims, 7 Drawing Sheets

MINIMIZATION OF PLASMA DOPING INDUCED FIN HEIGHT LOSS

BACKGROUND

Many developments in both semiconductor structures and manufacturing processes have contributed to reducing the size and increasing the performance of transistors used in integrated circuits. One recent advance in semiconductor structures has been the introduction of a transistor structure referred to as a finFET. FinFETs typically have advantages such as greater channel control, reduced short channel effect, and lower subthreshold leakage currents.

Integrated circuits often include electrical components in addition to transistors, such as, for example, diodes, capacitors, and resistors, each of which may be combined with finFETs to form an electrical circuit.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1A:
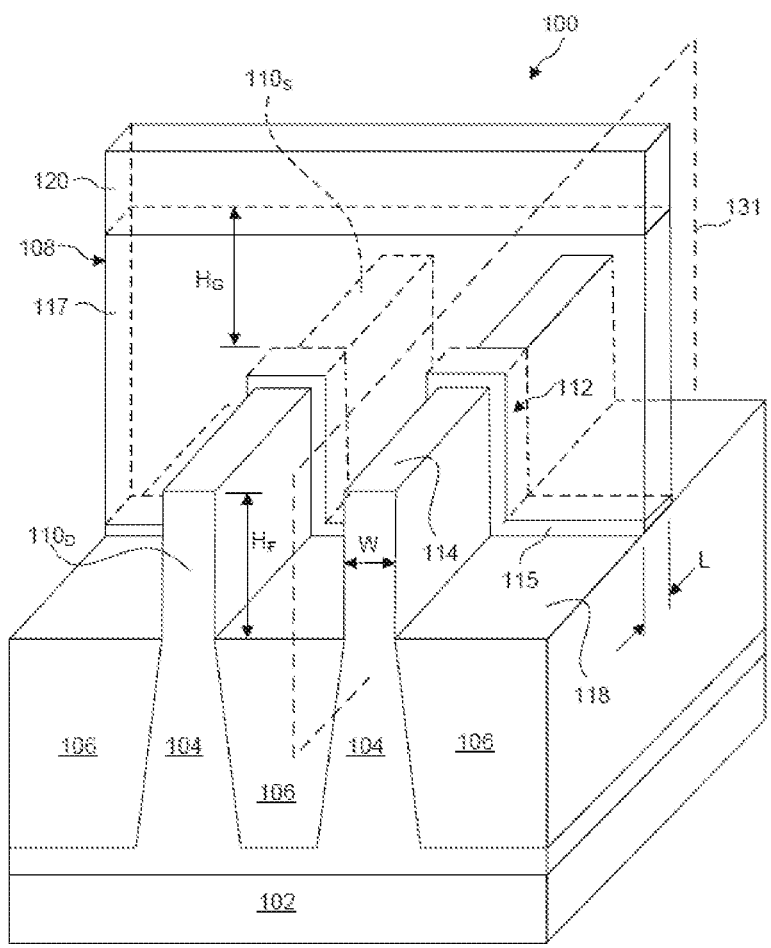
FIG. 1A is an isometric view of an exemplary semiconductor device structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the use of three-dimensional, vertically-oriented structures of semiconductor material called fins.

The term "finFET" refers to a FET that is formed over a silicon fin that is vertically oriented with respect to the planar surface of a wafer.

"S/D" refers to the source and/or drain junctions that form two terminals of a FET.

The expression "epitaxial layer" herein refers to a layer or structure of single crystal material. Likewise, the expression "epitaxially grown" herein refers to the process of growing a layer, or structure, of single crystal material. Epitaxially grown material may be doped or undoped.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

Various embodiments in accordance with this disclosure provide several benefits such as reduced parallel resistance and enhanced overall transistor performance compared to transistors manufactured in accordance with conventional semiconductor manufacturing processes. These benefits are realized by a plasma doping (PLAD) process used to form a lightly doped S/D region with a conformal doping profile and reduced fin height loss in fin-based semiconductor devices such as, but not limited to, finFETs, horizontal gate-all-around (HGAA) structures, and channel-on-oxide (COO) structures. Unlike conventional processes that apply a pulsed DC bias voltage signal to the substrate, the PLAD process in accordance with this disclosure features a combination of nominally constant voltage values, and voltage ramp conditions to prevent ion bombardment damage to the fin's top and sidewall surfaces. More specifically, the pulsed DC bias voltage pulse is replaced by a DC steady state voltage step, followed by a DC ramp voltage step, followed by a DC steady state voltage step at different stages of the process. By suitably adjusting the DC bias voltage characteristics of the applied bias voltage to the substrate during the PLAD process, highly conformal doping profiles with minimal fin height loss can be achieved.

Before describing the embodiments related to the design of finFET S/D regions, an example fabrication process for a finFET is presented. FIGS. 1A-4B provide various views of a semiconductor device that includes finFETs during various stages of fabrication. The fabrication process provided here is exemplary, and many other steps may be performed that are not shown in these figures.

Illustrated in FIG. 1A is an isometric view of a semiconductor structure 100. Semiconductor structure 100 includes finFETs. Semiconductor structure 100 includes a substrate 102, a plurality of fins 104, a plurality of isolation structures 106, and a gate structure 108 that is disposed over the sidewalls and top surface of each of fins 104. Fins 104 and isolation structures 106 have top surfaces 114 and 118, respectively. Gate structure 108 includes a gate dielectric structure 115, and a gate electrode structure 117. In alternative embodiments, one or more additional layers or structures may be included in gate structure 108. FIG. 1A shows a hard mask 120 disposed on a top surface of gate electrode layer 117. Hard mask 120 is used in the patterning process (e.g., combination of photolithography and etch steps) of the gate structure 108. In some embodiments, hard mask 120 is made of a dielectric material, such as silicon oxide, silicon nitride, or other suitable material well known to the skilled in the art. The isometric view of FIG. 1A is taken after the patterning process of the gate structure has been completed and the gate dielectric and gate electrode layers have been deposited. FIG. 1A of a semiconductor structure 100 shows only one gate structure 108. Those skilled in the art will understand that typical semiconductor structures in integrated circuits contain a plurality of such, or similar, gate structure(s) which are parallel to each other and perpendicular to the direction of the fins.

Each of the plurality of fins 104 shown in FIG. 1A includes a pair of S/D terminals. For ease of description, a first one of the pair of S/D terminals is referred to as a source region $110_S$ and a second one of the pair of S/D terminals is referred to as a drain region $110_D$, where S/D terminals are formed in, on, and/or surrounding fin 104. A channel region 112 of fin 104 underlies gate structure 108. Gate structure 108 has a gate length L, and a gate width $(2 \times H_F + W)$, as shown in FIG. 1A. In some embodiments, the gate length L is in a range from about 10 nm to about 30 nm. In some other embodiments, the gate length L is in a range from about 3 nm to about 10 nm. In some embodiments, the fin width W is in a range from about 10 nm to about 20 nm. In some other embodiments, the fin width W is in a range from about 3 nm to about 10 nm. Gate height $H_G$ of gate structure 108, measured from fin top surface 114 to the top of gate structure 108, is in a range from about 50 nm to about 80 nm, in some embodiments. Fin height $H_F$ of fin 104, measured from the isolation structure top surface 118 to fin top surface 114, is in a range from about 25 nm to about 35 nm, in some embodiments.

Substrate 102 may be a bulk silicon substrate. Alternatively, substrate 102 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, substrate 102 is a silicon on insulator (SOI). In another embodiment, substrate 102 may be an epitaxial material.

Isolation structures 106 are made of a dielectric material and may be formed of silicon oxide, silicon nitride, silicon oxynitride, fluorine-doped silicate glass (FSG), a low-k dielectric material, and/or other suitable insulating material with appropriate fill properties. Isolation structures 106 may be shallow trench isolation (STI) structures. In an embodiment, the isolation structures are STI structures and are formed after the fin formation in the substrate where the space between the fins is filled with insulating material, followed by chemical mechanical polishing (CMP) and etch back of the oxide to expose the fins. Those skilled in the art will understand that other fabrication techniques for forming isolation structures 106 and/or fins 104 are possible. Isolation structures 106 may include a multi-layer structure, for example, having one or more liner layers.

Fins 104 are active regions where one or more field effect transistors are formed. Fin 104 may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Fins 104 may be fabricated using suitable processes including a combination of one or more photolithography and etch processes steps.

Gate structure 108 may include a gate dielectric layer 115, a gate electrode layer 117, a spacer layer 111, and/or one or more additional layers. For ease of description, spacer layer 111 is not shown in FIG. 1A. In an embodiment, gate structure 108 uses polysilicon as gate electrode layer 117. Also shown in FIG. 1A is a hard mask 120 disposed on a top surface of gate electrode layer 117. Hard mask 120 is used in the patterning process (e.g., combination of photolithography and etch steps) of the gate structure 108. In some embodiments, hard mask 120 is made of a dielectric material, such as silicon oxide, silicon nitride, or other suitable material well known to the skilled in the art.

Although the isometric view of FIG. 1A shows gate structure 108 using polysilicon as the gate electrode layer 117, those skilled in the art will understand that gate structure 108 may be a sacrificial gate structure such as formed in a replacement gate process used to form a metal gate structure. The replacement gate process and many other steps may be performed and are not shown in these figures. The metal gate structure may include barrier layer(s), gate dielectric layer(s), work function layer(s), fill metal layer(s) and/or other suitable materials for a metal gate structure. In other embodiments, the metal gate structure may further include capping layers, etch stop layers, and/or other suitable materials.

Exemplary p-type work function metals that may be included in the metal gate structure include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the metal gate structure include Ti, Ag, TaAl, TaAlC, TiAlN, TaC, TaCN, TaSiN, Mn, Zr, other suitable n-type work function materials, or combinations thereof. The transistor's threshold voltage $V_t$ depends in part on the work function metal in the gate. Therefore, a suitable work function layer of appropriate composition and thickness must be selected. The work function layer(s) may be deposited by chemical vapor deposition (CVD), plasma-enhanced CVD (PECVD), physical vapor deposition (PVD), atomic layer deposition (ALD), plasma-enhanced ALD (PEALD) and/or other suitable deposition process. The fill metal layer may include Al, or W, and/or other suitable materials. The fill metal may be formed by CVD, PECVD, PVD, ALD, PEALD, plating, and/or other suitable processes. The fill metal may be deposited over the work function metal layer(s), thereby filling in the remaining portion of the trenches or openings formed by the removal of the sacrificial gate structure.

Semiconductor device structure 100 described above includes fins 104 and gate structure 108. The semiconductor device structure 100 needs additional processing to form the various features, such as lightly-doped regions and heavily doped regions of the source/drain (S/D) terminals. The lightly doped area of the S/D region is often referred to as a S/D extension or Lightly Doped Drain (LDD). The skilled in the art will understand that the term LDD is merely a naming convention and is not only limited to the drain region but also includes the lightly doped regions of the source junction as well. LDD is required to achieve dimensional reductions for the scaling of submicron devices. The LDD regions are placed at a close proximity to the edge of the channel region as defined by the offset spacer thickness, to provide a gradual dopant concentration to the S/D regions. The LDD creates complex lateral and vertical doping profiles in the interface region of the channel edge. If an LDD is not formed, then high electric fields are present between the S/D junctions and the channel region during normal transistor operation.

For the LDD formation ion implantation has been used as the doping process of choice for many technology nodes. However in recent nodes, due to the aggressive aspect ratio (AR) of the fins and the tight gate pitch (distance between two adjacent gates), ion implantation process is no longer considered a viable option. This is because ion implantation is susceptible to dopant shadowing effects for such aggressive geometries. Since ion implantation is a line of sight process, the dopant species can be blocked by the tightly pitched, or high AR, structures and fail to reach the area to be doped (dopant shadowing). This causes non-conformal dopant profiles in the doped areas of the fin such as in the LDD regions. To overcome dopant shadowing, plasma doping processes have been adopted. Plasma doping is not a line of side process and therefore no dopant shadowing occurs in aggressive geometries. Embodiments in accordance with the present disclosure are describing a plasma doping (PLAD) ramp process as the preferred doping process for LDD regions.

Figure 1B:
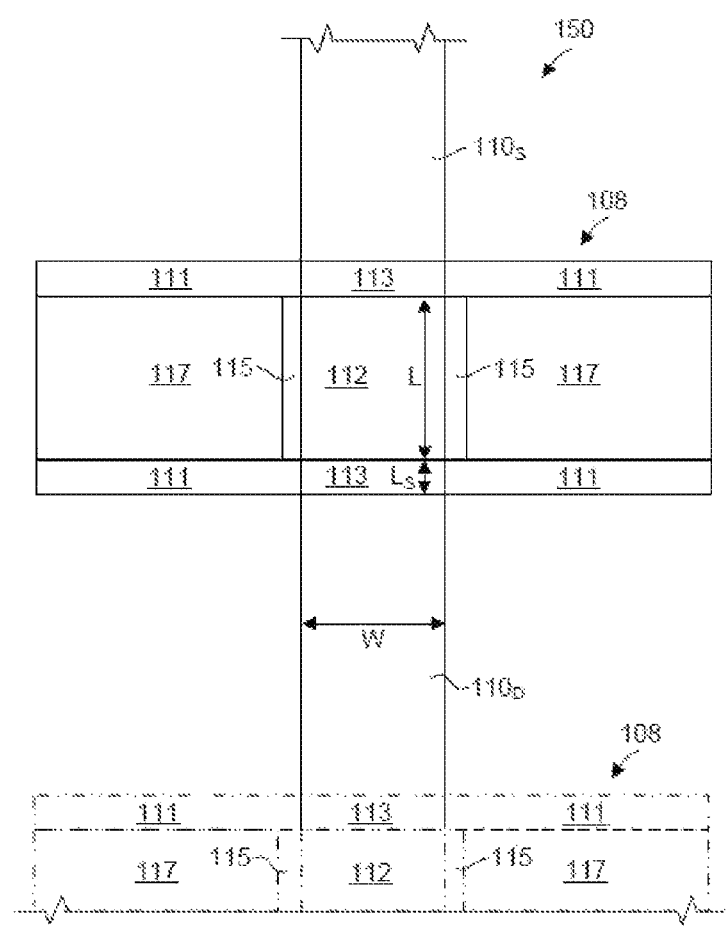
FIG. 1B shows a top view of an exemplary transistor region.

FIG. 1B shows a top view of a transistor region 150 formed with one of the fins 104 of FIG. 1A and taken on a surface level with the top surface 118 of isolation structure 106. Transistor region 150 includes S/D regions $110_S$ and $110_D$. Transistor region 150 also includes a channel region 112, which is part of fin 104 and is surrounded by gate structure 108 on three sides, as shown in FIG. 1A. The channel region 112 underlies the gate structure 108 and has a width (fin width) W. Depending on fabrication processing conditions and device designs, the length of channel region 112 may be slightly different from gate length L. Solely for the ease of description, the length of channel region 112 is denoted as gate length L. Transistor region 150 also includes gate dielectric layer 115 and gate electrode layer 117. FIG. 1B also shows spacers 111 formed on gate structures 108. LDD regions 113 are formed in the top surface and side walls of fin 104. LDD region 113 that is shown in FIG. 1B has a width W and a length $L_S$. FIG. 1B also shows another gate structure 108 by dotted lines. This other gate structure 108 has been described above as being similar and parallel to the gate structure 108 and is not shown in FIG. 1A.

Referring to FIGS. 2A through 2E, various perspective and cross-sectional views of a finFET at various stages of fabrication in accordance with this disclosure are shown.

Figure 2A:
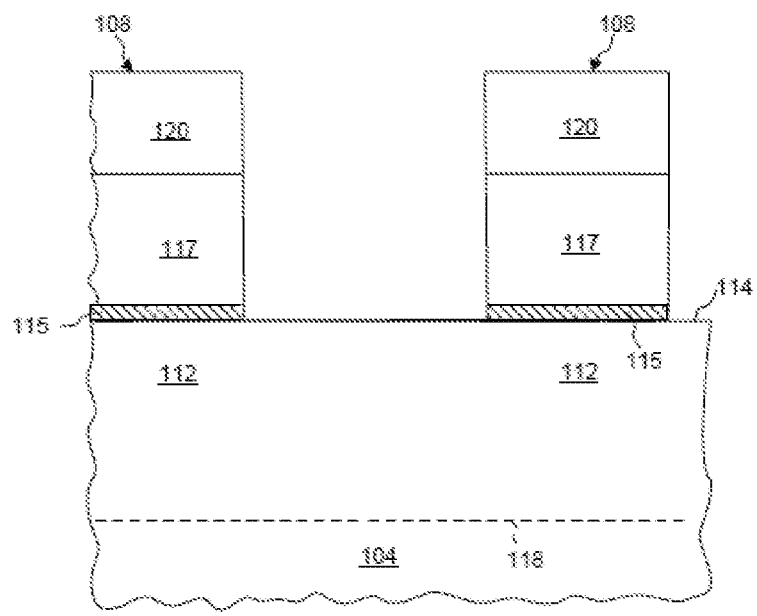
FIGS. 2A-2E show cross-sectional views of a partially fabricated finFET after each of a series processing steps according to this disclosure.

FIG. 2A shows two neighboring gate structures 108 formed over fin 104, taken along the cut 131 shown in FIG. 1A. Each gate structure 108 includes a gate electrode 117 and a gate dielectric 115. A hard mask 120 is disposed over gate electrodes 117. In some embodiments, hard mask 120 is used to define the patterning of gate electrodes 117. Hard mask 120 comprises any suitable material, including but not limited to, silicon nitride (SiN), silicon oxy-nitride (SiON), SiC, SiOC, spin-on glass (SOG), a low-k film, or a silicon oxide. Such silicon oxide may be formed by any suitable method including, but not limited to CVD with tetraethoxysilane (TEOS) as a source gas, PECVD oxide (PE-oxide), high-aspect-ratio-process (HARP) formed oxide. Channel regions 112, which are directly under the gate structures 108 are also noted in FIG. 2A. A dotted line 118 indicates the level of surfaces of isolation regions 106 shown in FIG. 1A.

Figure 2B:
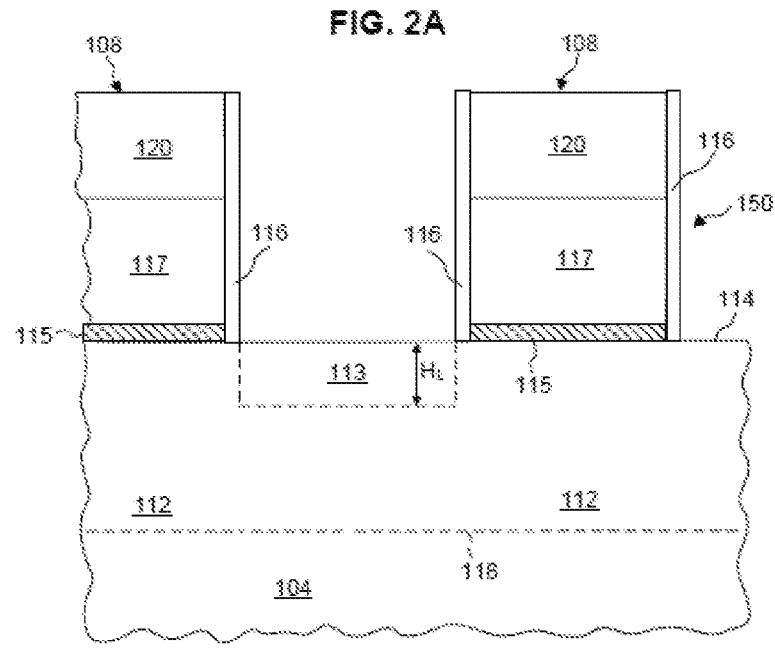

FIG. 2B shows an offset spacer 116 used to expose a portion of the channel region to LDD plasma dopants while blocking the plasma dopants from a portion of the channel region immediately next to the sidewalls of the gate electrode structures 117. To form an offset spacer 116, a blanket offset spacer layer is first deposited over the substrate and covers gate electrode structures 117, hardmask layer 120, and the S/D areas of fin top surfaces 114. Offset spacer 116 is made of a dielectric material, such as silicon oxide, SiON, or carbon-doped silicon nitride (SiCN). In some embodiments, the deposition process is a plasma-enhanced chemical vapor deposition (PECVD) process. Other suitable deposition processes may also be used. In some embodiments, the thickness of offset spacer 116 is in a range from about 2 nm to about 5 nm. Offset spacer 116 provides an offset distance, which is the thickness of offset spacer 116, from channel region 112 and prevents the dopants from PLAD process to reach into the channel region 112.

LDD regions 113 are then formed in the fin structure between adjacent offset spacers 116 using any suitable processes. For example, a PLAD process can be used to form LDD regions 113, and may utilize any suitable doping species. Although LDD regions 113 are shown as only being close to the top surface of fin 104, LDD regions 113 may actually be close to both the top surface and sidewalls of fin 104. The PLAD process offers a uniform doping profile on the top and sidewall surfaces of fin 104. Depending on the PLAD process conditions, LDD regions 113 may extend to a certain depth below the surfaces of fin 104. For example, LDD region 113 may extend to a depth of $H_L$ below the top surface of fin 104, as shown in FIG. 2B. It will be understood by those skilled in the art that the LDD region may also extend from the sidewall surfaces of fin 104 into the interior of fin 104. Substrate 102 could have both p-type and n-type devices. Additional processes, such as lithography masking processes, would be involved to protect the p-type device regions from dopant ions for n-type devices. The processing sequence involved in forming and doping the p-type devices are well known to those of ordinary skill in the art and are not further described in this disclosure.

During the typical PLAD process, a DC bias voltage pulse is applied to the substrate. For the duration of the pulse, the plasma ions (dopants) are accelerated towards the top 114 and sidewall surfaces 112 of the fin and cause damage due to ion bombardment. Because of this damage, in the subsequent photo resist removal step, the wet chemistry employed removes the damaged atoms from the fin causing significant fin height loss. This fin height loss changes the shape of the LDD regions, increases the parallel resistance (Rp), and adversely affects the transistor's performance. In some embodiments, the DC bias voltage pulse applied to the substrate during the PLAD process has been replace by a DC steady state voltage step, followed by a DC ramp voltage step, followed by a DC steady state voltage step.

After the doping process is complete, a thermal anneal is performed to drive in and to activate the dopants. The thermal anneal may utilize rapid thermal processing (RTP) anneal, spike anneal, millisecond anneal, or laser anneal. Spike anneal operates at peak anneal temperature for a time period on the order of seconds. Millisecond anneal operates at peak anneal temperature for a time period on the order of milliseconds, and laser anneal operates at peak anneal temperature for a time period on the order of microseconds.

Figure 2C:
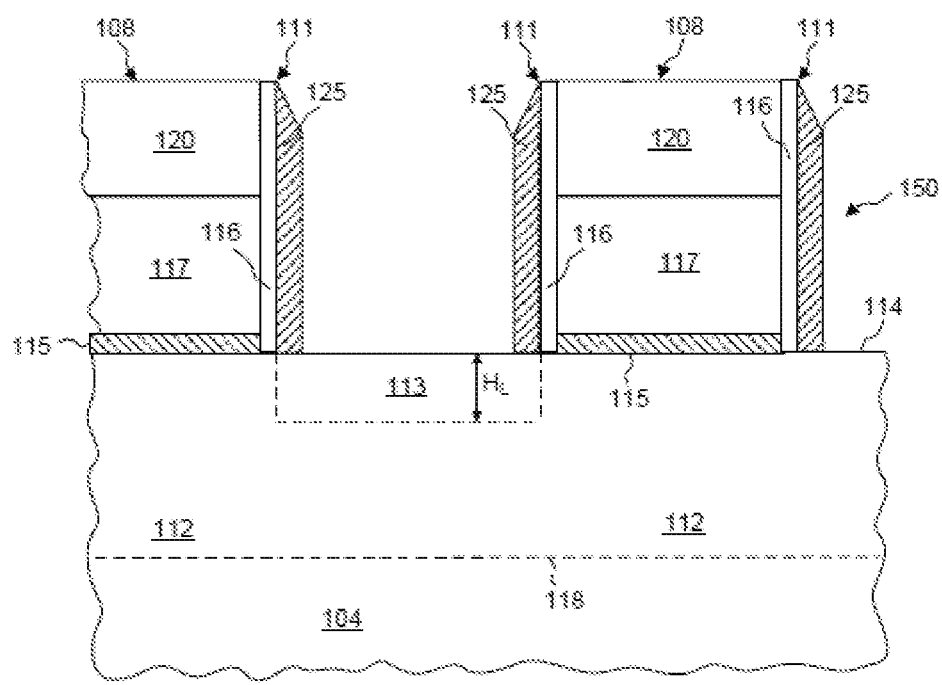

FIG. 2C shows main spacers 125 formed over transistor region 150, taken along the cut 131 shown in FIG. 1A. Main spacers 125 cover offset spacers 116, and may also cover a top surface of gate structure 108 (not shown in FIG. 2C). The thickness of main spacer 125 is in a range from about 5 nm to about 10 nm, which is sufficient to protect gate structure 108, the offset spacers 116 and the LDD regions 113 during subsequent etching of fin 104. Main spacers 125 are formed using an etch-back technique. For example, to form main spacer 125, a blanket main spacer layer is first deposited over the substrate, including gate structures 108 which have a hard mask layer 120 over the structures. An etch-back process is then used to remove portions of the blanket main spacer layer to form an opening and expose a portion of LDD region 113 for the subsequent fin etching process. The remaining blanket main spacer layer forms main spacers 125. Main spacer 125 is made of a dielectric material, such as SiON, silicon nitride (SiN), or carbon-doped silicon nitride (SiCN). SiCN has relatively low etch rate against etchants, such as $H_3PO_4$ and HF, in comparison to SiN or SiON. The deposition process for the main spacer is PECVD, however other suitable deposition processes may also be used. In some embodiments, each offset spacer 116 has a width in a range from about 5 nm to about 10 nm. A material removal process can be performed to remove main spacer 125 that has been formed over hard mask layer 120 and also over other portions of surfaces on substrate 102, for example, reactive ion etch (RIE) processes and/or other suitable processes. Taken together, offset spacers 116 and main spacers 125, are referred to as spacers 111. It is obvious to the skilled in the art that the main spacer 125 could be comprised of a single or multiple layers of the same or different materials.

Figure 2D:
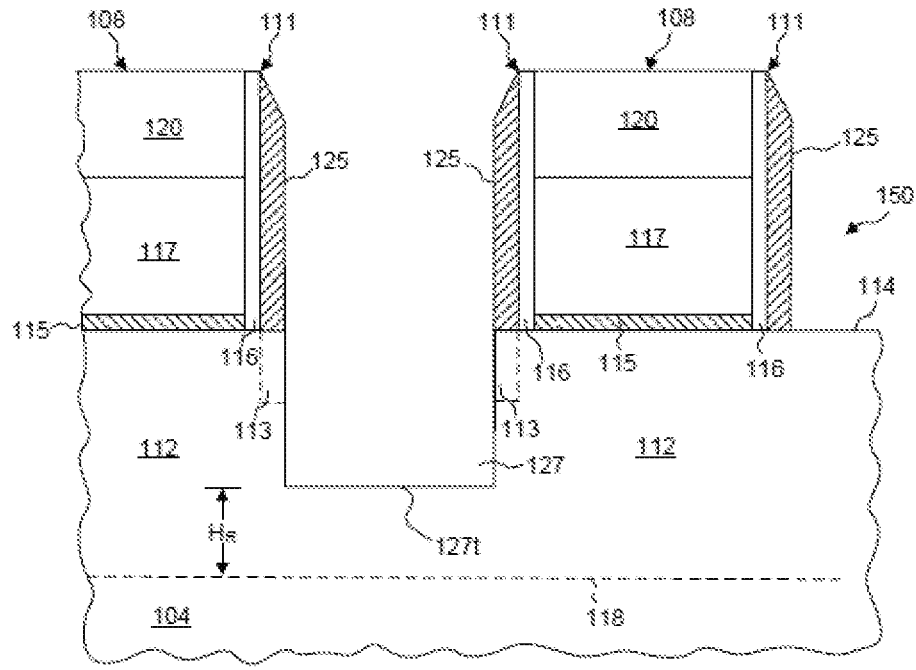

FIG. 2D shows recess 127 formed in the fin between neighboring gate structures 108, taken along the cut 131 shown in FIG. 1A. Exposed portion of fin 104 is etched using RIE processes and/or other suitable processes. An illustrative fin etching process may be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. Also, the bias voltage used in the illustrative etching process may be tuned to allow better control of an etching direction to achieve desired profiles for recess 127. In some embodiments, recess 127 may be formed to have either an angular or rounded shape at its bottom. Recess 127 has bottom surface 127t. As shown in FIG. 2D, bottom surface 127t is above the flat top surfaces 118 of isolation structure 106. In another embodiment, bottom surface 127t is below the flat top surfaces 118 of isolation structures 106. Spacers 111 and hard mask 120 are used as etch masks such that recess 127 is self-aligned with the opening formed by opposing spacers 111. Height $H_R$ measured from bottom surface 127t to isolation structure top surface 118 may be adjusted by the manufacturer. Recesses 127 may be formed to have either an angular or rounded shape at their bottoms.

Figure 2E:
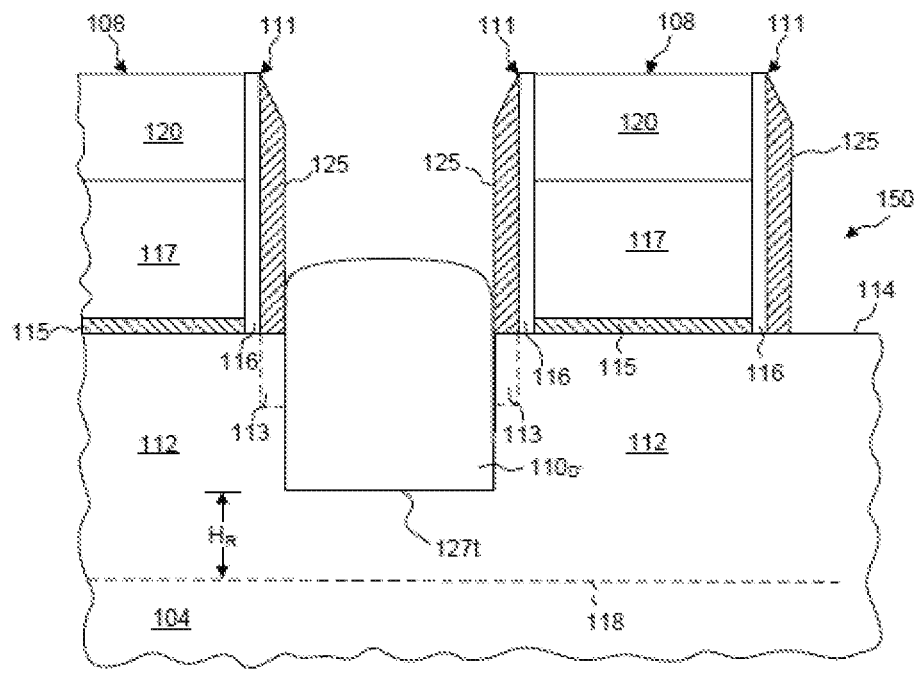

FIG. 2E shows that after recess 127 is formed, an epitaxial material is grown in recess 127 to form epitaxial doped S/D regions, $110'_D$ and $110'_S$ respectively. For ease of description, a first one of the pair of doped epitaxial S/D terminals is referred to as a source region $110'_S$ and a second one of the pair of doped S/D terminals is referred to as a drain region $110'_D$. In some embodiments the dopants in doped S/D regions $110'_D$ and $110'_S$, diffuse into LDD regions 113 during annealing. FIG. 2E shows that epitaxial material is grown in recess 127 to form doped drain regions $110'_D$, and for ease of description, doped source region $110'_S$ is not shown in FIG. 2E. At least a portion of each doped S/D region $110'_D$ and $110'_S$ is formed in recesses 127, and therefore is also self-aligned with the opening defined by opposing spacers 111.

In some embodiments, the epitaxial material filling recesses 127 to form doped S/D regions, $110'_D$ and $110'_S$, is a silicon-based material. In some embodiments, the epitaxially-grown silicon-based material is formed by an epitaxial deposition/partial etch process, which repeats the epitaxial deposition/partial etch process at least once. Such repeated deposition/partial etch process is also called a cyclic deposition-deposition-etch (CDDE) process. The deposition process forms a thin epitaxial layer of silicon-based material in recess 127 and an amorphous silicon-based material on non-crystalline surfaces. An etching (or partial etching) process removes the amorphous silicon-based material and also a portion of the silicon-based material in recesses 127. As a result of the process, silicon-based material is deposited in each of recesses 127 to form epitaxial S/D regions $110'_D$ and $110'_S$, respectively.

Still referring to formation of doped S/D regions, $110'_D$ and $110'_S$, in-situ doping processes may also be incorporated during or after the deposition of silicon-based material. For example, an n-type doping precursor, e.g., phosphine ($PH_3$) and/or other n-type doping precursors, can be used during the formation of the S/D regions of an n-type transistor. By using the in-situ doping process, the dopant concentration of silicon-based material can be desirably controlled. In some embodiments, silicon-based material can be an n-type doped silicon layer that is doped with phosphorus (Si:P). In some embodiments, silicon-based material can be an n-type doped silicon layer that is doped with both phosphorus and carbon (Si:CP). Carbon could impede the out-diffusion of phosphorus from silicon-based material. In some embodiments, silicon-based material can be an n-type doped silicon layer that is doped with arsenic. Other types of dopants may also be included. In some embodiments, the phosphorus dopant concentration is in a range from about $7\times10^{20}$ atoms/cm$^3$ to about $3\times10^{21}$ atoms/cm$^3$. In some embodiments, the carbon dopant concentration is in a range from about 0.1% to about 5% (atomic percent).

In some embodiments, silicon-based material can be formed by chemical vapor deposition (CVD), e.g., low pressure CVD (LPCVD), atomic layer deposition (ALD), ultrahigh vacuum CVD (UHVCVD), plasma enhanced CVD (PECVD), remote plasma CVD (RPCVD), any suitable deposition process; molecular beam epitaxy processes; any suitable epitaxial process; or any combinations thereof.

In some embodiments, the etching process can use an etching gas including at least one of hydrogen chloride (HCl), chlorine ($Cl_2$), other suitable etching gases, and/or any combinations thereof. The etching process removes the amorphous silicon-based material disposed over a non-crystalline surface at a rate higher than the removal rate of epitaxial silicon-based material. Therefore, only an epitaxial film remains on the substrate surface after a CDDE cycle. The epitaxial deposition/partial etch process is repeated a number of times until a desired thickness is reached.

Figure 3:
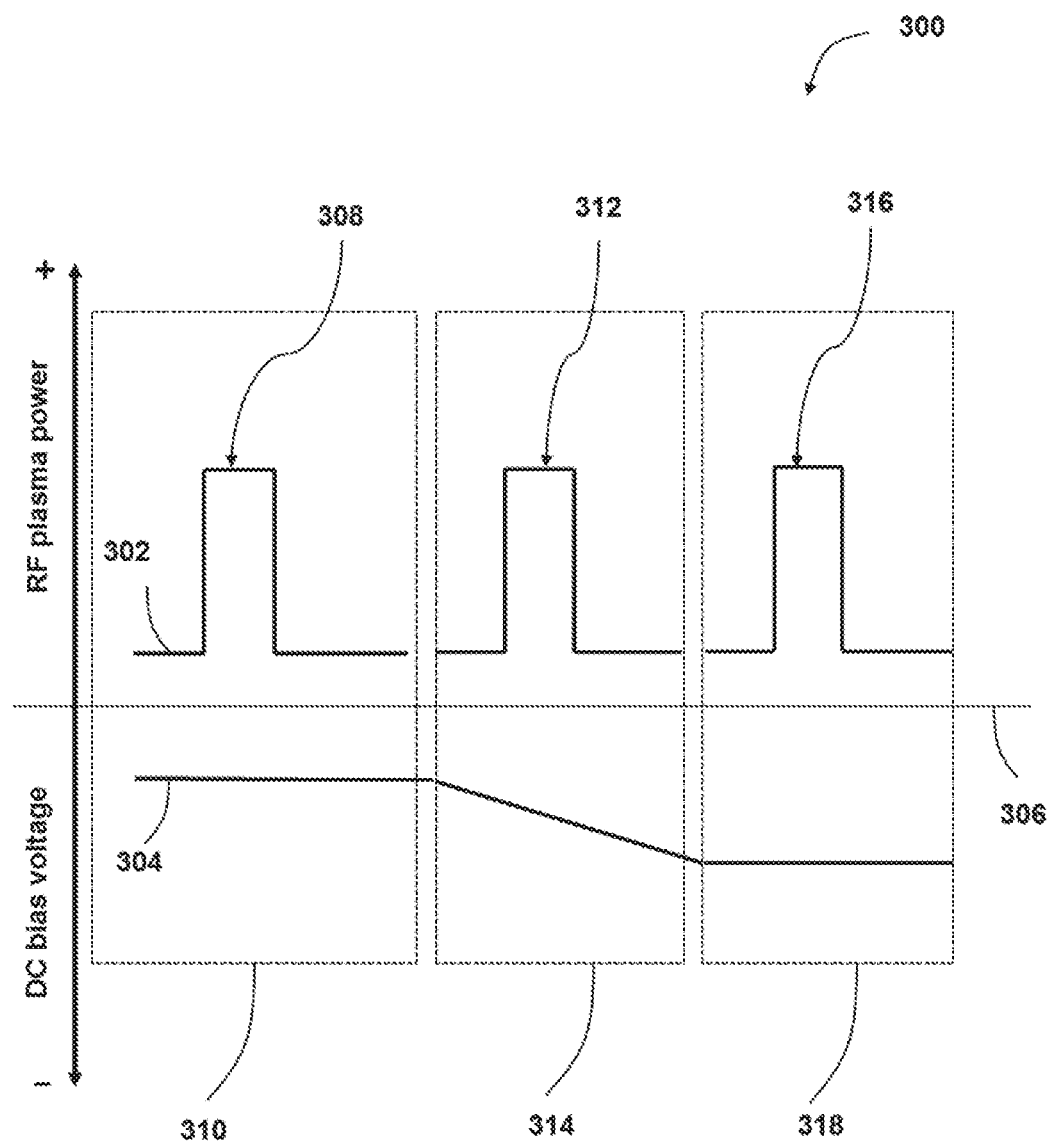
FIG. 3 shows a plasma doping process during the lightly doped source/drain region formation, in accordance with some embodiments

FIG. 3 illustrates an exemplary PLAD process 300 for forming LDD regions 113 shown in FIG. 2B. PLAD process 300 is a multiple cycle process having a high density, low energy RF plasma of ionized dopant species, and a bias voltage applied to the substrate to accelerate the ionized dopant species towards the surface of the substrate. In this illustration of exemplary PLAD process 300, two wave forms are shown the RF power and the bias voltage. An RF plasma power waveform 302 and a DC bias voltage signal 304 are synchronized in time as shown in the example of FIG. 3. The common axis between the two waveforms of RF plasma power 302 and bias voltage 304 represents time 306. During an exemplary cycle 308 RF power 302 is pulsed at a nominal frequency of 5 kHz. In this example, the RF plasma power is pulsed between 350 Watts and 600 Watts, and the cycle duration is 200 µs. Those skilled in the art will recognize that the RF plasma power and frequency characteristics may be different depending on the hardware configuration and the desired plasma dopant energy. For example the RF plasma power 302 can range from 200 to 1000 Watts. In this exemplary PLAD process 300 the plasma conditions are not altered and therefore the RF plasma power waveform 302 does not change between cycles.

In some embodiments, PLAD process 300 is divided into three discrete phases, each phase having a different bias voltage 304 applied to the substrate. These phases may be referred to as a "deposition mode" 310 where roughly 10% of the total dose is placed, a "transient mode" 314 where 10% to 20% of the total dose is placed, and an "implant mode" 318 where the 70% to 80% of the total dose is placed. The aforementioned dose percentages for each mode 310, 314, and 318 are exemplary and can be different in alternative embodiments. Bias voltage 304 can be applied to the substrate through, for example, an electrostatic chuck, or a clamping mechanism, or any other suitable methods.

In this exemplary embodiment the ionized dopant species are cations (i.e., positively charged ions). Those skilled in the art will recognize that the same principles apply for ionized dopant species that are anions (i.e., negatively charged ions), where reversed substrate bias conditions from the exemplary condition need to be applied. During exemplary deposition mode 310, bias voltage 304 is kept at a slightly negative value to prevent excessive ion bombardment on the substrate from any energetic ionized dopant species. During deposition mode 310 a thin layer of dopants is formed on the surface of the substrate. The thin dopant layer acts as an electrostatic barrier against any energetic ionized dopant species, and further protects the exposed fin surfaces from ion bombardment. Deposition mode 310 may use multiple cycles, such as exemplary cycle 308, to complete its phase of operation. Those skilled in the art will recognize that the number of cycles 308 selected and bias voltage 304 can be adjusted to different values according to the desired manufacturing process. In this example bias voltage 304 is set at −0.5 kV.

After deposition mode 310 is complete, transient mode 314 begins in exemplary cycle 312 where bias voltage 304 becomes more negative at a nominally constant rate (ramped down). Transient mode 314 may require multiple cycles like exemplary cycle 312 until bias voltage 304 reaches a predetermined value. Those skilled in the art will recognize that the number of cycles 312 required for completion of transient mode 314, the ramp rate, as well as the initial and final bias voltage values (range), can be adjusted. In this example, bias voltage 304 is ramped from −0.5 kV to −1.5 kV. During this voltage change, the ionized dopant species will start to feel a stronger electrostatic force towards the substrate as the substrate bias becomes more negative. As a result, there is a transition from deposition mode 310 to implant mode 318 where the ionized dopant species are exposed to the maximum electrostatic force at the minimum bias voltage value.

During implant mode 318 in PLAD process 300, bias voltage 304 is kept at its most negative value starting from exemplary cycle 316. Implant mode 318 may require multiple cycles like exemplary cycle 316 until the desired dopant concentration is reached. The desired dosage is monitored and calculated via a current signal from a faraday cup. Those skilled in the art will recognize that the number of cycles 316 required and substrate bias voltage 304 minimum negative value are configured according to the desired dopant concentrations disposed in or at the fin and that they can vary significantly depending on the desired doping profile.

Because of the barrier layer formation during deposition 310 and part of the implant 314 phases of PLAD process 300, silicon damage from energetic ionized dopant species is significantly reduced. As a result the fin height loss is mitigated to levels that do not cause Rp increases or transistor performance degradation. Those skilled in the art will recognize that there might be other combinations of the process phases described herein to achieve the desired result.

Figure 4:
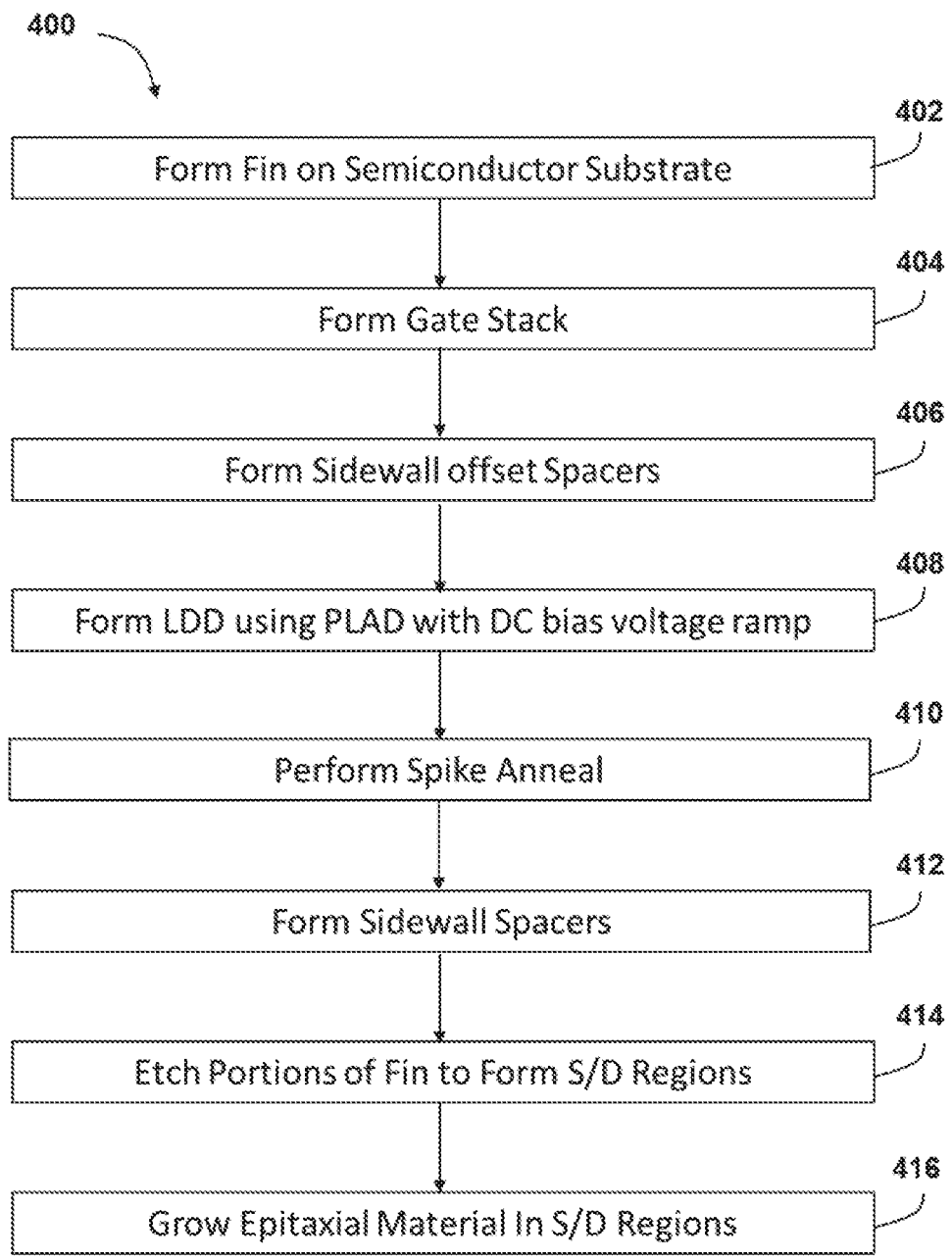
FIG. 4 is a flow diagram illustrating an exemplary method, in accordance with some embodiments.

FIG. 4 is a flow diagram of an illustrative method 400 of forming LDD regions using a PLAD process with a bias voltage ramp. Other fabrication steps may be performed between the various steps of method 400, and are omitted merely for clarity.

Method 400 begins with a substrate with its top layer being a semiconductor layer such as Si, Ge or a III-V compound semiconductor. Hereinafter such substrates are referred to as semiconductor substrates. For example, the semiconductor substrate is a bulk Si wafer, SOI wafer, Si on sapphire, and the like. Method 400 includes operation 402, patterning a semiconductor substrate to form a fin. The fin is vertical, i.e., it is nominally perpendicular to the surface of the substrate, and the fin may be rectangular or trapezoidal. In some embodiments the fin may have rounded corners where its top surface and sidewalls meet. The fin may be formed using a variety of dry etch techniques such as reactive ion etching or inductively coupled plasma etching.

Method 400 continues with operation 404, forming a gate stack on the fin, the gate stack having a first sidewall and a second sidewall. Forming the gate stack includes forming a gate dielectric on the fin, and then forming a gate electrode over the gate dielectric. Examples of gate dielectrics include, but are not limited to, one or more of silicon dioxide, silicon oxynitride, and high-k dielectric materials. The gate electrode may include a stack of various metal and metal alloy layers, or polysilicon.

Method 400 continues with operation 406, forming a first sidewall offset spacer adjacent to the first sidewall, and a second offset sidewall spacer adjacent to the second sidewall. The first and second offset sidewall spacers determine the proximity of the LDD region 113 to channel region 112.

Method 400 continues with operation 408, performing PLAD plasma doping on substrate 102 to dope LDD regions 113. LDD regions 113 are formed in the fin structure between opposing spacers. A plasma doping is performed to form LDD regions 113, and may utilize any suitable doping species. The process is divided into three discrete operation modes, or phases, that each have different bias voltages 304. These phases are deposition mode 310 where roughly 10% of the total dose is achieved, transient mode 312 where 10% to 20% of the total dose is achieved, and implant mode 314 where the 70% to 80% of the total dose is achieved. During each mode the substrate bias may be maintained at a predetermined nominal value or be ramped according to the detail description provided earlier. Because of the barrier layer formed during deposition 310 and transient 314 phases of PLAD process 300, silicon damage from energetic ionized dopant species is significantly reduced. As a result the fin height loss is mitigated to levels that do not cause an increase in parallel resistance or transistor performance degradation.

Method 400 continues with operation 410, where a thermal anneal is performed. This thermal anneal operation may be used to drive in and activate the dopants. The thermal anneal operation may utilize a rapid thermal processing (RTP) anneal, a spike anneal, a millisecond anneal, or a laser anneal. Spike anneal operates at peak anneal temperature for a time period on the order of seconds. Millisecond anneal operates at peak anneal temperature for a time period on the order of milliseconds, and laser anneal operates at peak anneal temperature for a time period on the order of microseconds.

Method 400 continues with operation 412 where the main spacers are formed. Main spacers 125 cover offset spacers 116, and may also cover a top surface of gate structure 108. Main spacers 125 are formed using an etch-back technique. For example, to form main spacer 125, a blanket main spacer layer is first deposited over the substrate, including gate structures 108 which have a hard mask layer 120 disposed thereon. An etch-back process is then used to remove portions of the blanket main spacer layer to form an opening and expose a portion of LDD region 113 for a subsequent fin etching process. The remaining blanket main spacer layer forms main spacers 125. Main spacer 125 is made of a dielectric material, such as SiON, silicon nitride (SiN), or carbon-doped silicon nitride (SiCN). SiCN has relatively low etch rate against etchants, such as $H_3PO_4$ and HF, in comparison to SiN or SiON. The deposition process for the main spacer layer is PECVD, however other suitable deposition processes may alternatively be used. In some embodiments, each offset spacer 116 has a width in a range from about 5 nm to about 10 nm. A material removal process can be performed to remove main spacer 125 that has been formed over hard mask layer 120 and also over other portions of surfaces on substrate 102, for example, reactive ion etch (RIE) processes and/or other suitable processes. Taken together, offset spacers 116 and main spacers 125, are referred to as spacers 111. Main spacer 125 could be comprised of a single or multiple layers of the same or different materials.

Method 400 continues with operation 414 where etching exposed portions of the fin is performed to form recesses in which at least portions of the S/D regions are disposed. These exposed portions of the fin are those portions that are not covered by the gate stack or spacers. Because the gate stack and the spacers act as an etch mask, they protect the fin underneath them from being etched. This etching may continue until the etched portions of the fin are recessed below the neighboring isolation material. This etching process may also stop before the etched portions of the fin are recessed below the neighboring isolation material. This exposed recessed interface acts as a nucleation site for subsequent epitaxial growth of materials.

Method 400 continues with operation 416, epitaxially growing material on the recessed interface to form S/D regions. The epitaxially-grown material may be a silicon-based, germanium based, or any other III-V compound semiconductor material such as GaAs, InP, GaP, GaN, InGaAs and the like; and may be formed by an epitaxial deposition/partial etch process. The process forms epitaxial. S/D regions, $110'_S$ and $HO'_D$, in recesses 127. Doping processes may also be incorporated in-situ or after the deposition of silicon-based material. Doped epitaxial S/D regions are also self-aligned with the opening defined by opposing spacers 111.

Owning to the initial dopant barrier layer formation during deposition 310 and implant 314 phases of PLAD process 300, the silicon damage to the fin due to ion bombardment from energetic ionized dopant species is significantly reduced. As a result, fin silicon loss at subsequent processing steps is mitigated to levels that prevent parallel resistance increases and ultimately transistor performance degradation.

In one embodiment, a method of forming a semiconductor structure with conformal LDD regions and with reduced fin height loss includes (a) forming a fin on a substrate, (b) forming a gate stack on the fin, (c) forming a gate sidewall offset spacer that defines the proximity of the LDD region to the channel region, (d) forming an LDD region by a PLAD process that includes applying a nominally constant bias voltage to the substrate and then ramping the bias voltage for a predetermined number of cycles and at nominally constant rate, and (e) performing a spike anneal.

In one embodiment, a method of forming a plurality of lightly doped source/drain (S/D) regions includes providing a substrate with a plurality of fins. Each fin having a top surface and a pair of opposing side surfaces with a gate structure disposed thereon. Exposing the substrate to a multiple-cycle plasma doping process having an RF plasma power and a plurality of RF power pulses and applying a DC bias voltage to the substrate. Maintaining the DC bias voltage at a nominally constant voltage for a first number of cycles, ramping the DC bias voltage at a nominally constant ramping rate for a second number of cycles, and maintaining the DC bias voltage at a nominally constant voltage for a third number of cycles.

In one embodiment, a method of forming a plurality of lightly doped source/drain regions includes providing a substrate with a plurality of fins. Each fin having a top surface and a pair of opposing side surfaces with a gate structure disposed thereon. Exposing the substrate to a multiple-cycle plasma doping process for a first predetermined number of cycles and applying a DC bias voltage to the substrate. Maintaining the DC bias voltage at a nominally constant voltage for a second predetermined number of cycles and ramping the DC bias voltage at a nominally constant rate for a third predetermined number of cycles.

It is to be appreciated that the Detailed Description section, and not the Summary or Abstract of the Disclosure sections, is intended to be used to interpret the claims. The Summary and Abstract of the Disclosure sections may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of fins over a substrate, each fin of the plurality of fins having a top surface and a pair of opposing side surfaces;
   disposing a gate structure on a fin of the plurality of fins, the gate structure having a first sidewall and a second sidewall;
   disposing a first offset spacer on the first sidewall and a second offset spacer on the second sidewall; and
   forming a first doped source/drain (S/D) region adjacent to the first offset spacer and a second doped S/D region adjacent to the second offset spacer, wherein forming the first and second doped S/D regions comprises:
      forming a plasma of ionized dopant species that comprises radio frequency (RF) plasma power pulses having a constant amplitude;
      after forming the plasma of ionized dopant species, applying a first negative direct current (DC) bias voltage to the substrate to form a dopant layer of the ionized dopant species on the top surface of each of the fins; and
      linearly decreasing the first negative DC bias voltage to a second negative DC bias voltage to increase a concentration of the ionized dopant species in the dopant layer.

2. The method of claim 1, wherein the first negative DC bias voltage is about −0.5 kV and the second negative DC bias voltage is about −1.5 kV.

3. A method, comprising:
   receiving a substrate with fins thereon, each fin having a top surface, a pair of opposing side surfaces, and a gate structure disposed thereon; and
   doping the fins with ionized dopants using a plasma doping process comprising:
      applying a radio frequency (RF) plasma with a constant amplitude pulse configured to generate the ionized dopants;
      applying a first direct current (DC) bias voltage to the substrate to form a layer of ionized dopants on the top surface of each of the fins;
      linearly transitioning the first DC bias voltage applied to the substrate to a second DC bias voltage configured to increase an electrostatic force on the ionized dopants; and
      after linearly transitioning the first DC bias voltage to the second DC bias voltage, applying the second DC bias voltage to the substrate to increase a dopant concentration of the ionized dopants in each of the fins.

4. The method of claim 3, wherein the RF plasma with the constant amplitude pulse comprises a frequency of about 5 kHz.

5. The method of claim 3, wherein the first DC bias voltage is −0.5 kV and the second DC bias voltage is −1.5 kV.

6. The method of claim 3, wherein the constant amplitude pulse has an amplitude of about 250 Watts and a duration of about 200 μs.

7. A method, comprising:
   receiving a substrate with fins thereon; and
   forming source/drain (S/D) regions by doping the fins with a plasma doping process comprising:
      forming a radio frequency (RF) plasma of ionized dopant species that comprises RF power pulses with a constant amplitude;
      applying a first direct current (DC) bias voltage to the substrate to form a first dopant layer of ionized dopant species on the fins, wherein the first dopant layer comprises about 10% of a total ionized dopant species dose achieved by the plasma doping process;
      after forming the first dopant layer, linearly increasing the first DC bias voltage to a second DC bias voltage to form a second dopant layer of ionized dopant species on the fins, wherein the second dopant layer comprises between about 10% and about 20% of the total ionized dopant species dose achieved by the plasma doping process; and
      after forming the second dopant layer, applying the second DC bias voltage to the substrate increase a concentration of the ionized dopant species in the second dopant layer and form a third dopant layer of ionized dopant species comprising between about 70% and about 80% of the total ionized dopant species dose achieved by the plasma doping process.

8. The method of claim 7, wherein the first DC bias voltage is −0.5 kV.

9. The method of claim 1, wherein forming the first and the second doped S/D regions further comprises:
   after linearly decreasing the first negative DC bias voltage to the second negative DC bias voltage, applying the second negative DC bias voltage to the substrate to increase the concentration of the ionized dopant species in the dopant layer.

10. The method of claim 9,
    wherein applying the first negative DC bias voltage implants a first dopant dose of the ionized dopant species comprising about 10% of a total dopant dose of the ionized dopant species,
    wherein linearly decrease be first negative DC bias voltage to the second negative DC bias voltage implants a second implant dose of the ionized dopant species comprising between about 10% and about 20% of the total dopant dose of the ionized dopant species, and
    wherein applying the second negative DC bias voltage implants a third dopant dose of the ionized dopant species comprising between about 70% and about 80% of the total dopant dose of the ionized dopant species.

11. The method of claim 10, wherein each of the first second and third dopant doses are respectively associated with a first, a second, and a third number of the RF plasma power pulses different from one another.

12. The method of claim 3, wherein the second DC bias voltage is greater than the first DC bias voltage.

13. The method of claim 7, wherein the second DC bias voltage is −1.5 kV.

14. The method of claim 7, wherein the second DC bias voltage is less than the first DC bias voltage.

15. The method of claim 7,
    wherein applying the first DC bias voltage comprises applying the first DC bias voltage for a first number of the RF power pulses,
    wherein linearly increasing the first DC bias voltage to the second DC bias voltage comprises linearly increasing the first DC bias voltage to the second DC bias voltage for a second number of RF power pulses, and
    wherein applying the second DC bias voltage comprises applying the second DC bias voltage for a third number of the RF power pulses.

16. The method of claim 1, wherein the RF plasma power pulses have a nominal frequency of 5 kHz.

17. The method of claim 1, wherein the constant amplitude of the RF plasma power pulses is about 250 Watts.

18. The method of claim 1, wherein the first negative DC bias voltage attracts the ionized dopant species with a lower electrostatic force than the second negative DC bias voltage.

19. The method of claim 3, wherein the first DC bias voltage is configured to exert a lower electrostatic force to the ionized dopants than the second DC bias voltage.

20. The method of claim 7, wherein the second DC bias voltage is more positive than the first DC bias voltage.

\* \* \* \* \*